United States Patent
Jayasekara

(10) Patent No.: US 7,839,606 B2
(45) Date of Patent: Nov. 23, 2010

(54) MAGNETIC HEAD HAVING OXIDIZED READ SENSOR EDGES TO REDUCE SENSOR CURRENT SHUNTING

(75) Inventor: Wipul Pemsiri Jayasekara, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 818 days.

(21) Appl. No.: 11/449,913

(22) Filed: Jun. 9, 2006

(65) Prior Publication Data

US 2007/0285849 A1 Dec. 13, 2007

(51) Int. Cl.
*G11B 5/33* (2006.01)
(52) U.S. Cl. ...................................... 360/322
(58) Field of Classification Search .................. 360/322
See application file for complete search history.

(56) References Cited

U.S. PATENT DOCUMENTS

| | | | |
|---|---|---|---|
| 6,219,212 B1 | 4/2001 | Gill et al. | |
| 6,256,176 B1 * | 7/2001 | Mao et al. | 360/324.1 |
| 6,262,869 B1 * | 7/2001 | Lin et al. | 360/324.11 |
| 6,571,139 B1 | 5/2003 | Kawamura et al. | |
| 6,754,056 B2 | 6/2004 | Ho et al. | |
| 6,785,954 B2 * | 9/2004 | Horng et al. | 29/603.14 |
| 6,888,707 B2 * | 5/2005 | Horng et al. | 360/324.12 |
| 7,469,465 B2 * | 12/2008 | Ding et al. | 29/603.12 |
| 2001/0025978 A1 | 10/2001 | Nakao | |
| 2003/0030948 A1 | 2/2003 | Umetsu | |
| 2003/0053268 A1 * | 3/2003 | Lin et al. | 360/324.1 |
| 2003/0072111 A1 | 4/2003 | Hasegawa et al. | |
| 2003/0137782 A1 | 7/2003 | Ho et al. | |
| 2003/0163913 A1 | 9/2003 | Hasegawa et al. | |
| 2003/0206382 A1 | 11/2003 | Carey et al. | |
| 2004/0095691 A1 | 5/2004 | Lin et al. | |
| 2005/0063100 A1 * | 3/2005 | Kautzky et al. | 360/313 |
| 2005/0068694 A1 | 3/2005 | Nakabayashi et al. | |
| 2005/0264950 A1 * | 12/2005 | Gill | 360/324.11 |
| 2007/0047153 A1 * | 3/2007 | Zeltser | 360/324 |
| 2007/0047159 A1 * | 3/2007 | Zhao et al. | 360/324.12 |
| 2007/0121249 A1 * | 5/2007 | Parker | 360/126 |

* cited by examiner

*Primary Examiner*—Mark Blouin
(74) *Attorney, Agent, or Firm*—Patent Law Office of Larry Guernsey; Larry B. Guernsey

(57) ABSTRACT

A magnetic read head of either CIP or CPP configuration is disclosed having a read sensor having oxidized non-conductive regions. The read sensor has a front edge, a rear edge, a left-side edge and a right-side edge. For a CIP configuration, the front edge and the rear edge are oxidized to form non-conductive regions. For a CPP configuration, the left-side edge, the right-side edge, the front edge and the rear edge are oxidized to form non-conductive regions. Also disclosed are a disk drive including a read sensor having oxidized non-conductive regions, and a method of fabrication for a read sensor having oxidized non-conductive regions.

20 Claims, 8 Drawing Sheets

MAGNETIC HEAD HAVING OXIDIZED READ SENSOR EDGES TO REDUCE SENSOR CURRENT SHUNTING

BACKGROUND OF THE INVENTION

1. Field of the Invention

The present invention relates generally to magnetic heads for reading data written to storage media, and more particularly to magnetic read heads for disk drives.

2. Description of the Prior Art

A computer disk drive stores and retrieves data by positioning a magnetic read/write head over a rotating magnetic data storage disk. The head, or heads, which are typically arranged in stacks, read from or write data to concentric data tracks defined on surface of the disks which are also typically arranged in stacks. The heads are included in structures called "sliders" onto which the read/write sensors of the magnetic head are fabricated. The slider flies above the surface of the disks on a thin cushion of air, and the surface of the slider which faces the disks is called an Air Bearing Surface (ABS).

The goal in recent years is to increase the amount of data that can be stored on each hard disk. If data tracks can be made narrower, more tracks will fit on a disk surface, and more data can be stored on a given disk. The width of the tracks depends on the width of the read/write head used, and in recent years, track widths have decreased as the size of read/write heads has become progressively smaller. This decrease in track width has allowed for dramatic increases in the recording density and data storage of disks. Thus, as the track width of recorded information decreases, the width of the read/write heads correspondingly decreases.

The read head track width refers to the width of the read head sensor from the right edge to the left edge, and the stripe height refers to the length dimension from the rear edge to the front edge, which will be part of the Air Bearing Surface (ABS). Both of these dimensions are very important to the operating characteristics of the read head and are very tightly controlled during fabrication. The sensor width and stripe height of read sensors are defined usually by ion milling. In addition the Air Bearing Surface of the slider as a whole, including the front surface of the read sensor, must be lapped to produce the final surface.

During the milling and lapping operations, the magnetic material that makes up certain layers of the sensor typically becomes damaged at any or all of these four edges. As a result, portions of the sensor near these edges may become magnetically inactive. These damaged areas are typically 10 to 100 Angstroms ($10\text{-}100 \times 10^{-10}$ meters). However, as read heads become smaller and smaller in size, these damaged areas become a larger proportion of the overall sensor head area.

Although these damaged areas are magnetically inactive, they are still electrically conductive. They can act as electrical shunts which conduct current which would ideally be channeled through the magnetically active areas which produce the magnetoresistive effect by which the sensor operates.

There are two configurations of read head in common use in the industry today. These are called Current In the Plane (CIP) and Current Perpendicular to the Plane (CPP). A magnetic disk drive having a read head of the CIP configuration 40 is shown in FIG. 4, and discussed in more detail below. For CIP read heads 40, the read sensor 50 is generally sandwiched between two insulation layers, usually designated G1 36 and G2 38 which are made of non-conductive material, to keep the circuit from shorting out. The current flows into and out of the plane of the paper in the pictured figure, through the read sensor 50 rather than vertically, from top to bottom.

In the CPP configuration 42, current flows vertically or from electrical leads positioned above and below the read sensor 50 through the sensor and a read head of this configuration is shown in FIG. 5. In this configuration of read head 42 where Current is Perpendicular to the Plane (CPP), shields S1 30 and S2 34 may also serve a dual function as electrical leads supplying current to the read sensor 50 which lies between them. However, it is also possible to provide separate layers between the shields of high conductivity, non-magnetic material to provide the primary function as electrical leads (not shown). An insulation layer 32 also separates the S1 30 and S2 34 electrical leads in the area behind the read sensor 50, so that they do not short out along their length.

In both CIP and CPP configurations, damage occurs to edge regions of the read sensor during fabrication processes used to produce the final dimensions of the read sensor. These damaged areas are shown in FIGS. 6-7 (prior art), which are top plan views of a read sensor 50 of a magnetic disk drive head 14, with FIG. 6 (prior art) showing a CIP configuration 40 and FIG. 7 (prior art) showing a CPP configuration 42. The read sensor 50 is shown having a front edge 60, rear edge 62, a left side 64 and a right side 66. The dimension between the left side 64 and right side 66 determines the sensor width 68, and is generally established during the sensor-width patterning operation. The distance from the front edge 60 to the rear edge 62 is known as the stripe height 69. The extent of the rear edge 62 is typically established by ion milling during the stripe height patterning operation. The front edge 60 achieves its final dimension and surface finish later when the slider is lapped to define the final ABS.

During certain stages of fabrication of the sensor 50, damaged regions 78 are formed. Thus, the sensor-width patterning produces a left-side damaged region 74 and a right-side damaged region 76; stripe height patterning produces a rear-edge damaged region 72; and front surface lapping produces a front-edge damaged region 70. These damaged regions, 70, 72, 74, and 76 are magnetically inactive, due to disordering of the magnetic materials; but they remain electrically conductive; and can shunt current. Thus, the effectiveness and sensitivity of the read sensor 50 is reduced. These damaged regions are typically in the range of 10 to 100 Angstroms in width.

The CIP configuration 40 is shown in FIG. 6 (prior art), in which the read sensor 50 is flanked by electrical leads 54. Since the current is in the plane, the current moves horizontally, as indicated by the arrow 1. The front damaged region 70 and rear damaged region 72 are shown to shunt current through these regions, as indicated by arrows 3. Current still flows through the main sensor region, and the read sensor 50 can still be expected to function, but its performance is degraded due to the shunting effect of the front damaged region 70 and rear damaged region 72.

The CPP configuration 42 is shown in FIG. 7 (prior art), in which the read sensor 50 is flanked by hard bias material 56. In this configuration, it is common practice to include layers of dielectric insulation 90 between the read sensor 50 and the hard bias material 56 to prevent shunting of the sense current away from the CPP sensor. Since the current is perpendicular to the plane, the current moves into or out of the plane of the paper, as indicated by the circled cross 5. In this configuration, the front damaged region 70, rear damaged region 72, left-side damage region 74 and right-side damage region 76 all shunt current without contributing to the magnetic operation of the sensor 50. Again, current still flows through the main sensor region, and the read sensor 50 can still be expected to function, but its performance is degraded to some degree due to the shunting effect of the front damaged region 70, rear damaged region 72, left-side damage region 74 and a right-side damage region 76.

Thus, there is need for a method and structure which prevent damaged and magnetically inactive areas from acting as shunts which detract from the performance of the magnetically active areas of the read head sensor.

SUMMARY OF THE INVENTION

A preferred embodiment of the present invention is a magnetic read head of either CIP or CPP configuration. The read head includes a read sensor having a front edge, a rear edge, a left-side edge and a right-side edge. For a CIP configuration, the front edge and the rear edge are oxidized to form non-conductive regions. For a CPP configuration, the left-side edge, the right-side edge, the front edge and the rear edge are oxidized to form non-conductive regions. Also, disclosed are a disk drive including a read sensor having oxidized non-conductive regions, and a method of fabrication for a read sensor having oxidized non-conductive regions.

It is an advantage of the magnetic head of the present invention that damaged regions which do not contribute to the functioning of the sensor are made non-conductive so that shunting of current is reduced.

It is another advantage of the magnetic head of the present invention that for read sensors of the CIP configuration, damaged regions at the front and rear edges are made non-conducting.

It is yet another advantage of the magnetic head of the present invention that for read sensors of the CPP configuration, damaged regions at the left edge, right edge and front and rear edges are made non-conducting.

It is a further advantage of the magnetic head of the present invention that efficiency of read sensors is improved by reduction of electrical current shunting in damaged regions.

It is a yet further advantage of the magnetic head of the present invention that potential signal improvement of read sensors is obtained by reduction of electrical current shunting in damaged regions.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

Figure 1:
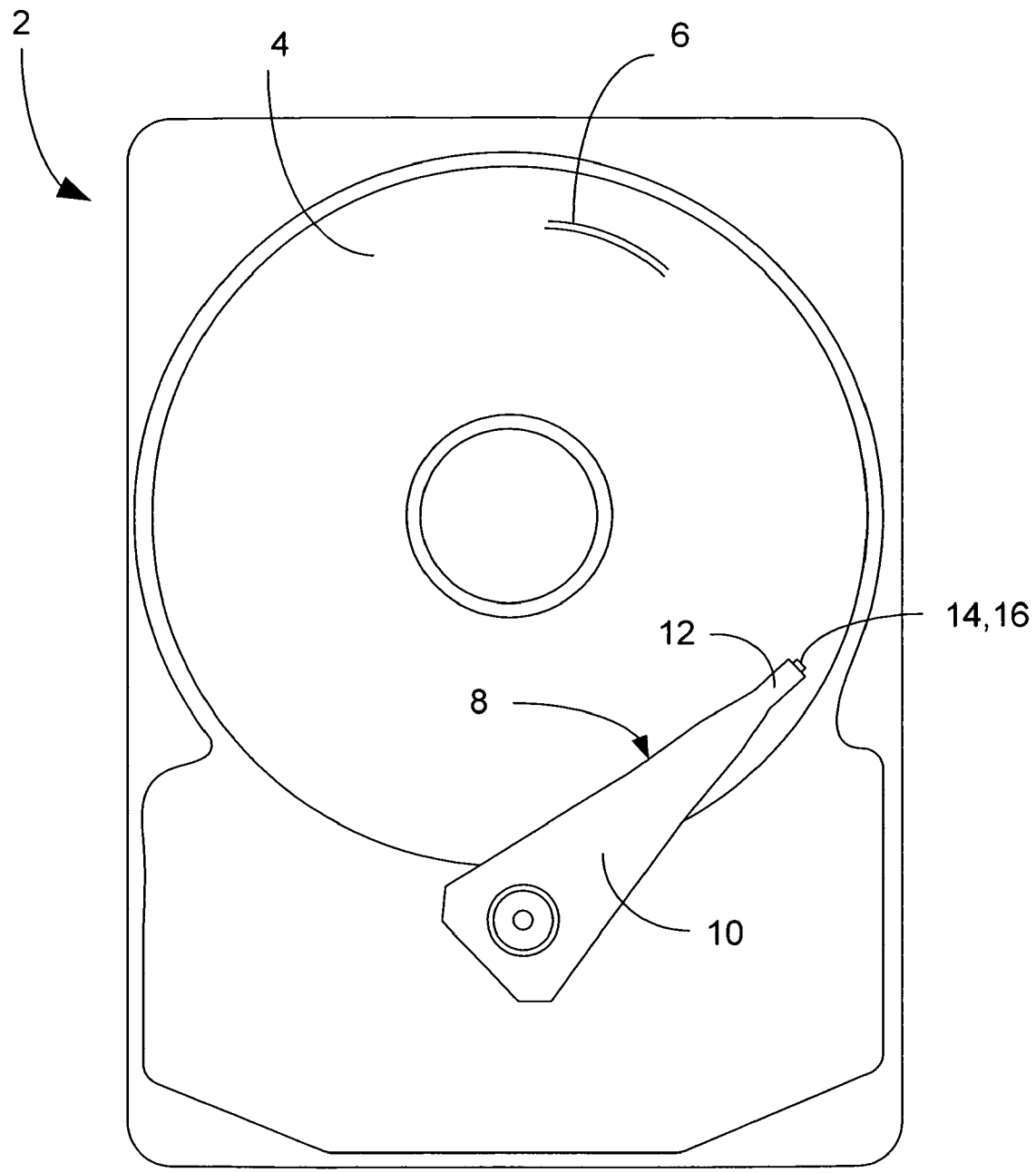
FIG. 1 shows a top plan view of an exemplary disk drive.

A magnetic disk drive 2 is shown generally in FIG. 1, having one or more magnetic data storage disks 4, with data tracks 6 which are written and read by a data read/write device 8. The data read/write device 8 includes an actuator arm 10, and a suspension 12 which supports one or more magnetic heads 14 included in one or more sliders 16.

Figure 2:
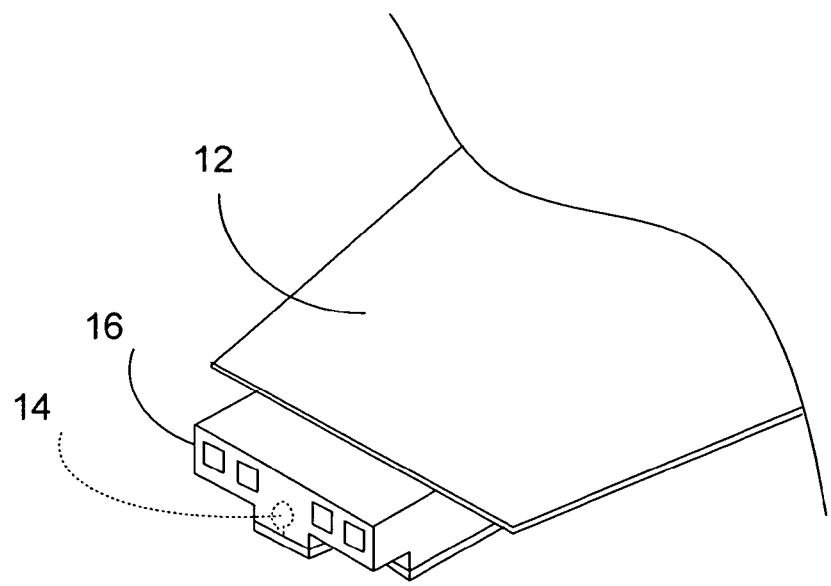
FIG. 2 illustrates a perspective view of an exemplary slider and suspension.
Figure 3:
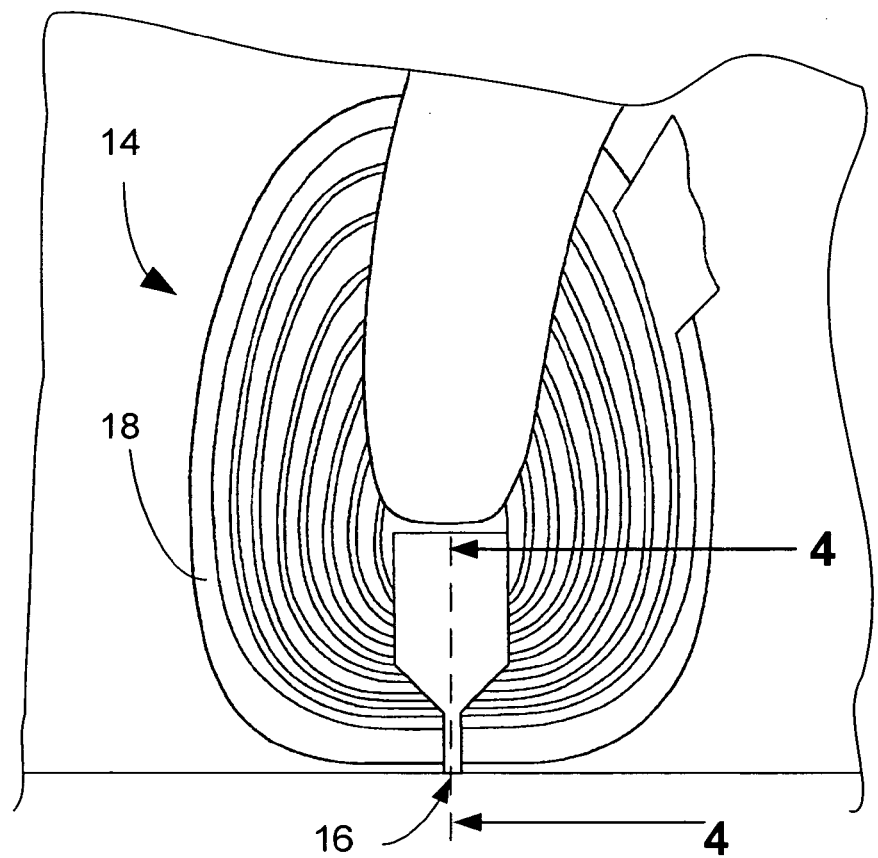
FIG. 3 shows a top plan view of an exemplary read/write head.
Figure 4:
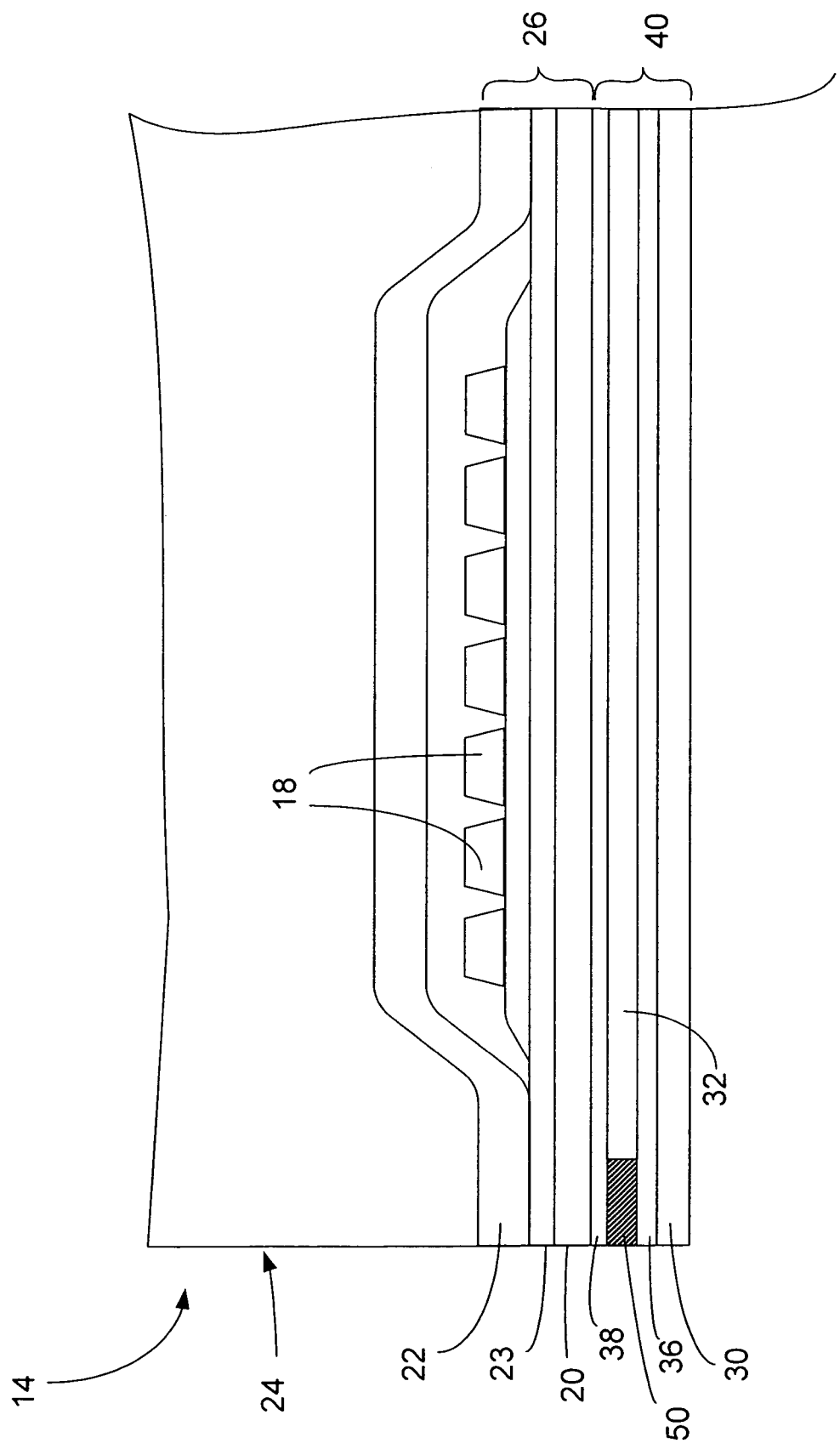
FIG. 4 is a cross-section view of an exemplary CIP read/write head.

FIG. 2 shows a slider 16 in more detail being supported by suspension 12. The magnetic head 14 is shown in dashed lines, and in more detail in FIGS. 3 and 4.

There are two configurations of read head in common use in the industry today. These are called Current In the Plane (CIP) and Current Perpendicular to the Plane (CPP), where the plane of reference is that of the layers of sensor stack material. The magnetic head 14 shown in FIG. 4 has a read head of a configuration known as Current In the Plane (CIP) 40 in which the current flows through the sensor perpendicularly in and out of the plane of the paper in the pictured figure rather than vertically or horizontally. The magnetic head 14 includes an induction coil 18, a first magnetic pole P1 20, and a second magnetic pole P2 22 which is separated from the P1 pole 20 by a write gap 23. The P1 pole 20, second pole P2 22 and write gap 23 can be considered together to be included in the write head 26. For CIP read heads, the read sensor 50 is generally sandwiched between two insulation layers, usually designated G1 36 and G2 38 which are made of non-conductive material, to keep the sensor circuit from shorting out. Two magnetic shields 30 and 20 (as shown the P1 pole also serves as a second magnetic shield, but a separate second magnetic shield can be provided) sandwich the G1 36 and G2 38 insulation layers. The magnetic head 14 flies on an air cushion between the surface of the disk 4 (see FIG. 1) and the air bearing surface (ABS) 24 of the slider 16.

Figure 5:
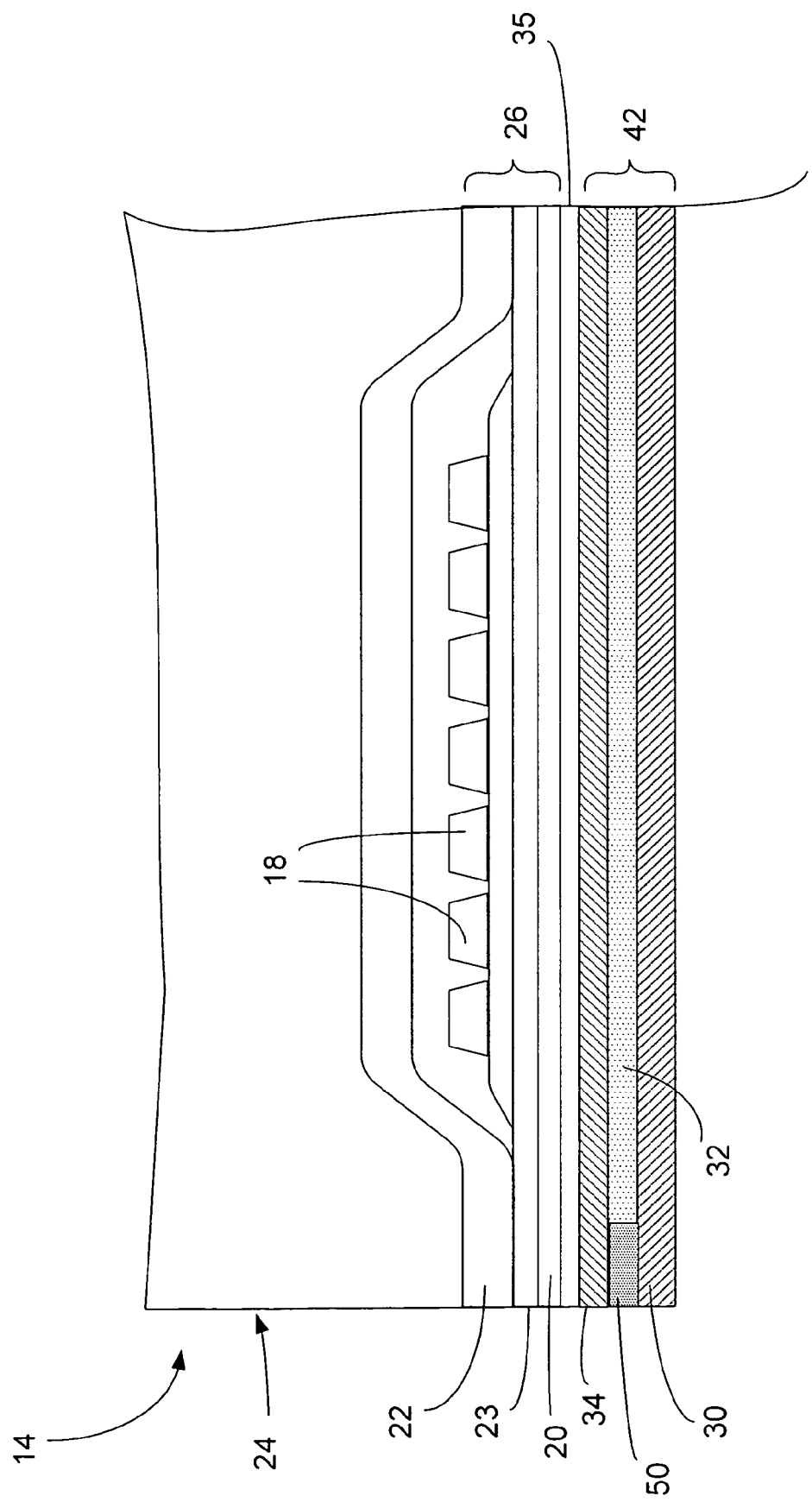
FIG. 5 is a cross-section view of an exemplary CPP read/write head.

The magnetic head 14 shown in FIG. 5 is of a configuration known as Current Perpendicular to Plane (CPP) 42, meaning that current flows through the sensor vertically in the pictured figure rather than horizontally or perpendicularly in and out of the plane of the paper. The magnetic head 14 includes a coil 18, a first magnetic pole P1 20, and a second magnetic pole P2 22 which is separated from the P1 pole 20 by a write gap 23. The P1 pole 20, second pole P2 22 and write gap 23 can be considered together to be included in the write head 26.

A read sensor 50 is sandwiched between a first magnetic shield, designated as S1 30 and a second magnetic shield S2 34, and these elements together make up the read head 42. These are shown separated from the write head 26 by an electrically insulating, non-magnetic layer 35, usually composed of alumina. In this configuration of read head 42 where Current is Perpendicular to the Plane (CPP), shields S1 30 and S2 34 act as electrical leads supplying current to the read sensor 50 which lies between them. An insulation layer 32 also separates the S1 30 and S2 34 electrical leads in the area behind the read sensor 50, so that they do not short out along their length. The magnetic head 14 flies on an air cushion between the surface of the disk 4 (see FIG. 1) and the air bearing surface (ABS) 24 of the slider 16.

Figure 6:
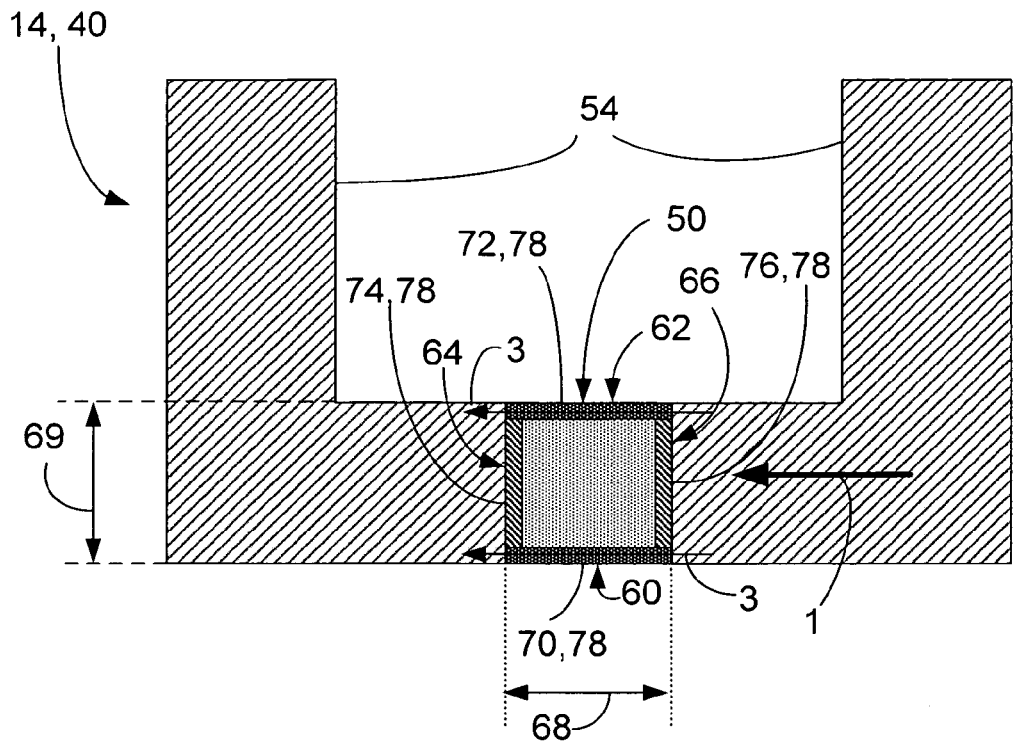
FIG. 6 is a top plan view of a CIP read sensor and hard bias/lead layer of the prior art.
Figure 8:
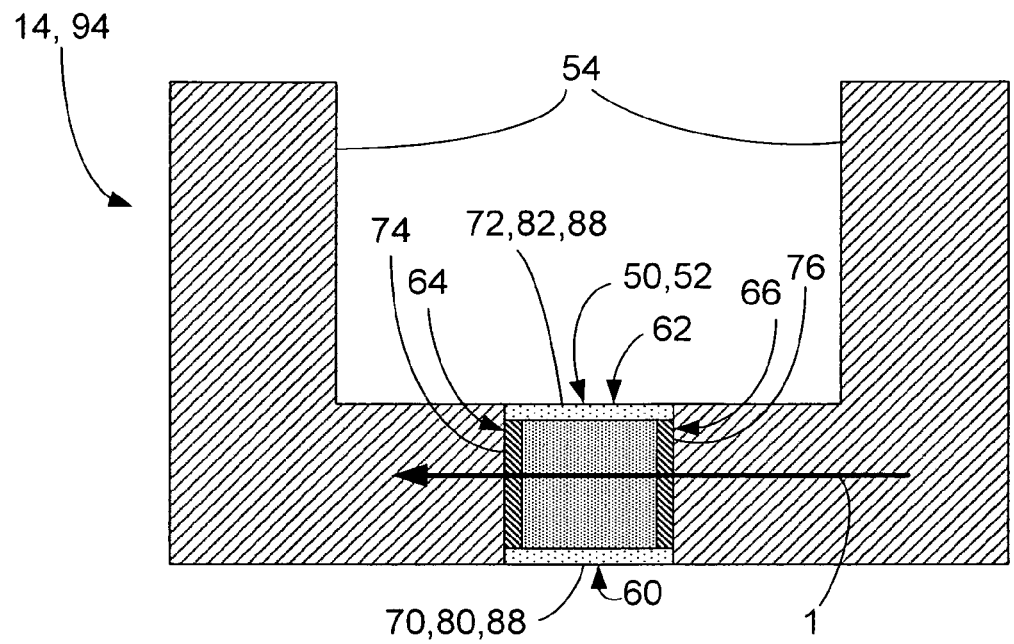
FIG. 8 is a top plan view of a CIP read sensor with non-conductive regions and hard bias/lead layer of the present invention.
Figure 9:
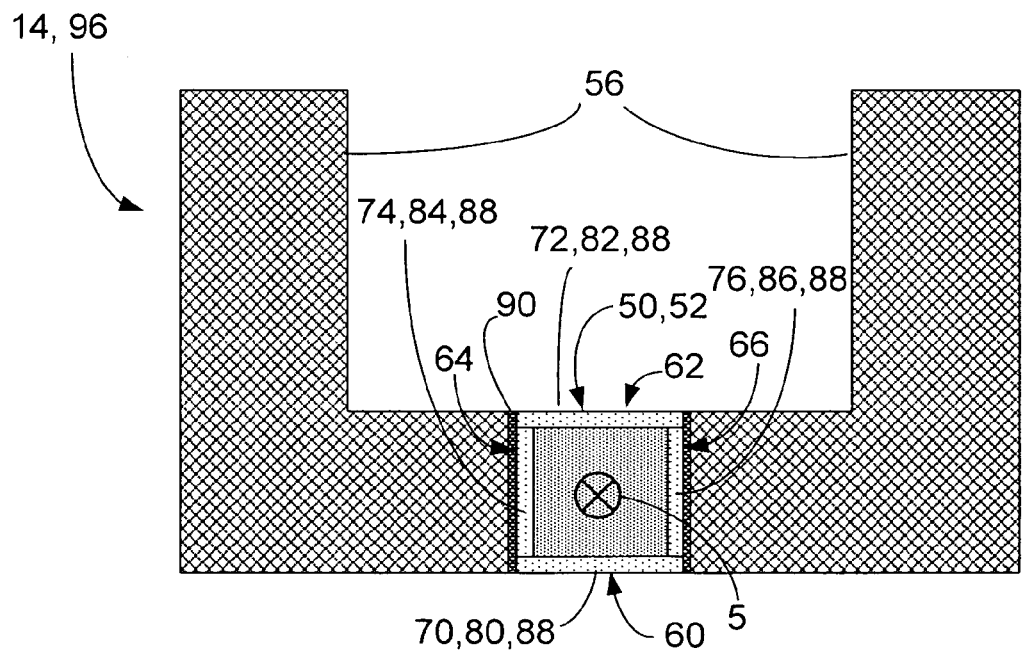
FIG. 9 is a top plan view of a CPP read sensor with non-conductive regions and hard bias layer of the present invention.

The present invention is designed to work with both CIP and CPP configuration sensors. FIG. 8 shows a CIP configuration 94 which includes oxidation regions 88 of the present invention and FIG. 9 shows a CPP configuration 96 which also includes oxidation regions 88 of the present invention. The read sensor 50 is again shown having a front edge 60, rear edge 62, a left side 64 and a right side 66. As discussed above, the dimension between the left side 64 and right side 66 determines the sensor width 68 (see FIG. 6), and is generally established during the sensor-width patterning operation. The distance from the front edge 60 to the rear edge 62 is known as the stripe height 69 (see FIG. 6). The extent of the rear edge 62 is typically fixed by ion milling during the stripe height patterning operation. The front edge 60 achieves its final dimension and surface finish later when the entire ABS of the slider 14 is lapped.

Figure 7:
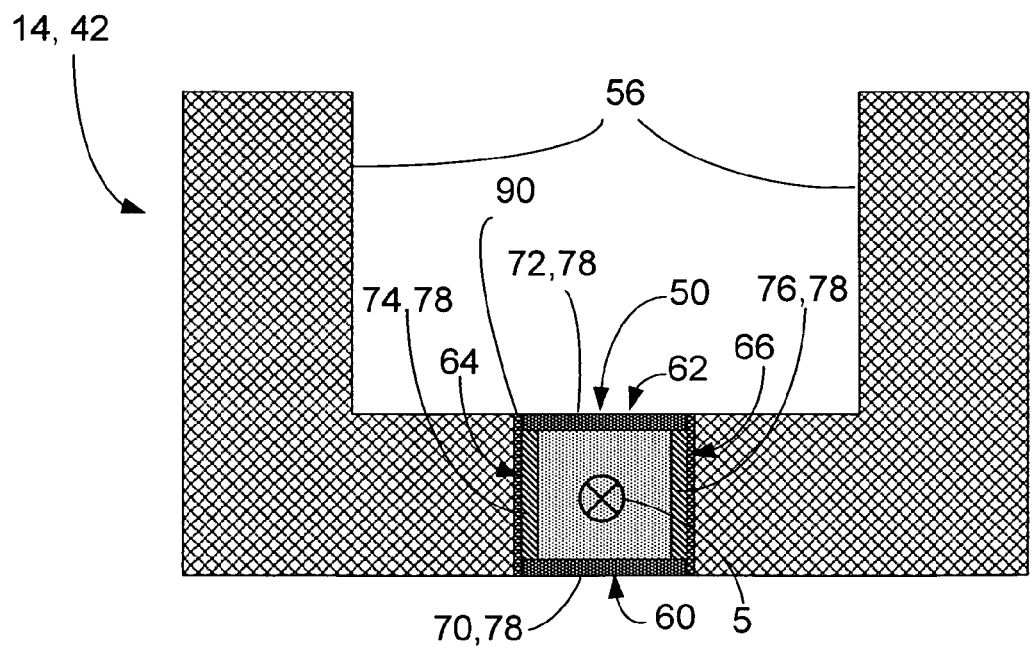
FIG. 7 is a top plan view of a CPP read sensor and hard bias layer of the prior art.

As discussed above, the milling and lapping operations typically produce damaged regions in the layers of ferromagnetic material of the sensor stack, such as the free magnetic layer and the pinned magnetic layer, as are well known in the art, and which are not visible in the figure. These damaged regions 78 (see FIGS. 6 and 7 (prior art)) include a front damaged region 70, rear damaged region 72, left-side damage region 74 and right-side damage region 76. These damaged regions 78 can shunt current without contributing to the magnetic operation of the sensor 50. These damaged regions are typically in the range of 10 to 100 Angstroms in width.

In order to minimize this current shunting effect, the present invention renders some or all of these damaged regions 70, 72, 74, 76 electrically non-conductive, depending on whether the sensor 50 is of the CIP configuration 40 or CPP configuration 42. This is done by subjecting some or all of the edges to an oxidation process which makes the damaged regions electrically non-conductive and thus blocks the shunting effect, and increases the effectiveness of the sensor 50. In the oxidation process, portions of the sensor 50 are exposed to oxygen plasma, nitrogen plasma or ozone exposure after ion milling, such as is done on the rear edge 62, and left side 64 and right side 66. Also exposure to oxygen plasma, nitrogen plasma or ozone is performed after lapping of the front edge 60. These processes shall be referred to collectively as "oxidation" or being "oxidized", even though it is understood that the nitrogen plasma does not result in actual exposure to oxygen.

FIG. 8 shows a plan view of a CIP configuration read head 94. The read sensor 50 includes a sensor stack 52, having a number of layers, as are known in the art. The read sensor stack 52 is shown having a front edge 60, rear edge 62, a left side 64 and a right side 66. Damaged regions are produced during the fabrication process in which the sensor stack 52 is trimmed to its final dimensions, including a left-side damage region 74 and a right-side damage region 76, rear-edge damage region 72, and front-edge damage region 70. In the CIP configuration 94, the read sensor 50 is flanked by electrical leads 54, and the current flows from one electrical lead 54, through the sensor 50 to the other electrical lead 54. Since the current is in the plane, the current moves horizontally in the figure, as indicated by the arrow 1. Beneath the electrical leads layer 54 is a hard bias layer, which is not visible in this view.

In order to prevent the front-edge damage region 70 and rear-edge damage region 72 from shunting current, these regions have been oxidized, and are thus referred to now as non-conductive regions 88, which in this CIP configuration 94 include a front oxidized region 80, and a rear oxidized region 82. It will be understood that although a left-side damage region 74 and a right-side damage region 76 exist, since they lie perpendicular to the direction of current travel, they do not contribute to shunting of the current. Further, if the left-side damage region 74 and right-side damage region 76 were to be oxidized, they would interfere with the overall current flow. Thus, there is no attempt to oxidize these regions in the CIP configuration 94.

In the CPP configuration 96, which is illustrated in FIG. 9, current flows between shield S2 34 (see FIG. 5) acting as an electrical lead above the sensor 50 and shield S1 30 (see also FIG. 5) acting as an electrical lead below the sensor 50. Alternately, separate electrical conducting layers can be interposed between the top shield and sensor and bottom shield and sensor to serve as leads. Returning to FIG. 9, the sensor 50 is shown flanked by hard bias material 56. In this configuration, it is common practice to include layers of dielectric insulation 90 between the read sensor 50 and the hard bias material 56 to prevent the shunting of sense current away from the sensor. In this CPP configuration 96, the left-side damage region 74 and right-side damage region 76, do contribute to shunting of current. Thus, it is preferred that the left-side damage region 74 and the right-side damage region 76, in addition to the rear-edge damage region 72, and front-edge damage region 70 are all oxidized to respectively produce left-side oxidized region 84, right-side oxidized region 86, rear-edge oxidized region 82, and front-edge oxidized region 80. The current, shown by the circled arrow, now flows without shunting, and thus efficiency of the sensor 50 is increased. Since these damaged regions are typically in the range of 10 to 100 Angstroms in width, the oxidized regions will preferably also be of equal size.

The increase in performance of the present invention compared to the prior art is not trivial, and can be calculated as follows:

The potential signal improvement G may be calculated by the relationship $$G=1/(SH/SH_{dead}-1)$$

where SH is the stripe height and $SH_{dead}$ is the total width of the magnetically inactive (damaged) region that is shunting current. G is the improvement in signal if this area is made totally non-conductive.

Where approximately 20 Angstroms of the sensor edge is oxidized, the potential signal improvement can be calculated for different stripe heights as ~4% for 50 nm stripe height
~6% for 35 nm stripe height
~9% for 25 nm stripe height.

Figure 10:
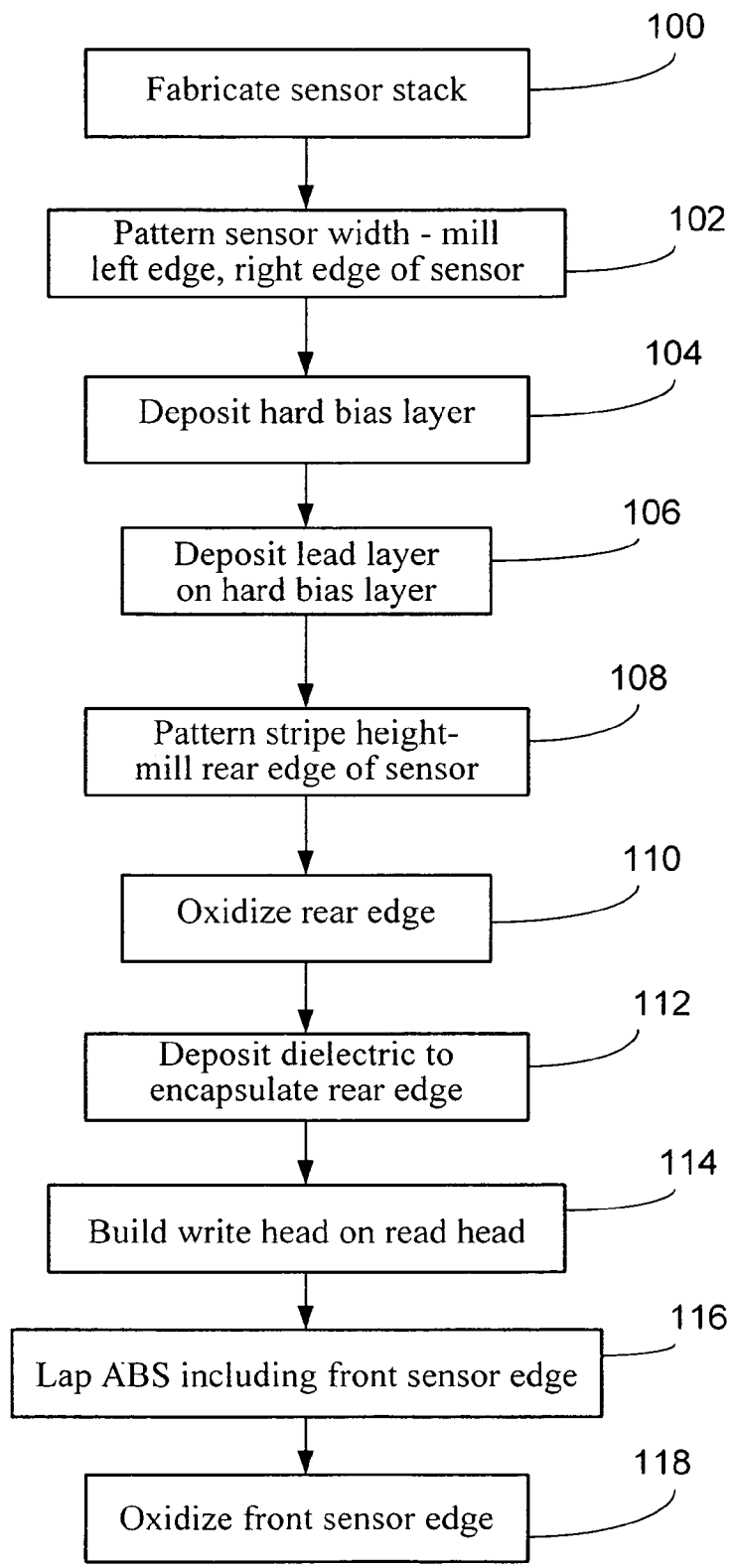
FIG. 10 is a flowchart showing the major stages in the fabrication of magnetic head having a CIP read sensor with non-conductive regions of the present invention.

The method of fabrication of the magnetic read/write head including a read sensor with reduced electrical current shunting can have many variations, both for the CIP and CPP configurations. The presently preferred method of fabrication for the CIP configuration is shown in flowchart form in FIG. 10. The method will be described from the point where the sensor stack has been fabricated 100, in any of the variations of layers as is known in the art. The width of the sensor is then established as the left edge and right edge of the sensor stack are milled 102. Next, the hard bias layer is deposited 104 and a lead layer is deposited on the hard bias layer 106. The sensor stripe height is next established by milling the rear edge of the sensor 108. The rear edge of the sensor is then oxidized 110, by any of the processes discussed above, including oxygen or nitrogen plasma or others such that sensor material is oxidized at the edge. Next, dielectric is deposited to encapsulate the back edge of the sensor 112. The write head is then built on read head 114. The ABS is then lapped including front sensor edge 116. Finally, the front sensor edge is oxidized 118. Thus, both the front sensor edge and the rear sensor edge are rendered non-conductive, and the shunting effect in these areas is reduced or eliminated.

Figure 11:
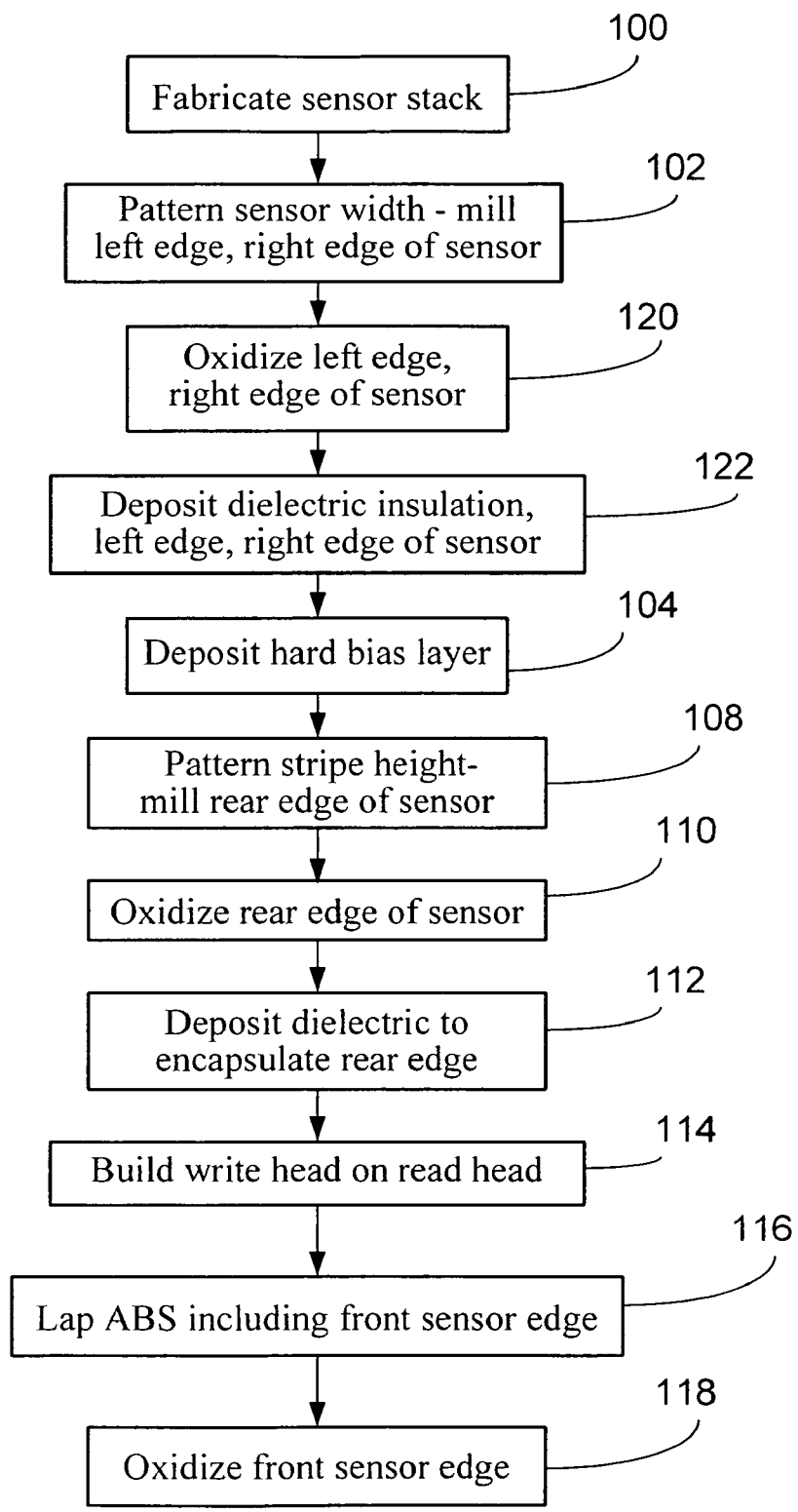
FIG. 11 is a flowchart showing the major stages in the fabrication of magnetic head having a CPP read sensor with non-conductive regions of the present invention.

The presently preferred method of fabrication for the CPP configuration is shown in flowchart form in FIG. 11. This method has several stages in common with the CIP fabrication stages discussed above, and the same numbers will be used to refer to these stages, where applicable. Again, the method will be described from the point where the sensor stack has been fabricated 100, as is known in the art. The width of the sensor is then established as the left edge and right edge of the sensor stack are milled 102. Next, the left edge and right edge of the sensor are oxidized 120 by any of the processes discussed above. A dielectric material is then deposited to encapsulate the left edge and right edge of the sensor 122. Next, the hard bias layer is deposited 104 and the sensor stripe height is established by milling the rear edge of the sensor 108. The rear edge of the sensor is then oxidized 110, and dielectric is deposited to encapsulate the back edge of the sensor 112. The write head is then built on read head 114. The ABS is then lapped including front sensor edge 116. Finally, the front sensor edge is oxidized 118. At this point, the front sensor edge, rear sensor edge, and right and left sensor edges are rendered non-conductive, and the shunting effect in these areas is reduced or eliminated.

It should be noted that various masks and masking materials can be used in conjunction with the oxidation process, so that for example, the remainder of the ABS can be masked before the front edge of the sensor is oxidized. The mechanics of masking are well known to those skilled in the art, and will not be discussed here. It should also be noted that the order of some of these operations can be changed; for example, the stripe height can be patterned before the sensor width is patterned.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

1 arrow
2 magnetic disk drive
3 arrow
4 magnetic data storage disks
5 circled cross
6 data tracks
8 data read/write device
10 actuator arm
12 suspension
14 magnetic heads
16 sliders
18 coil
20 P1 pole
22 second pole P2
23 write gap
24 ABS
26 write-head portion
30 first shield S1
32 insulation
34 second shield S2
36 G1 insulation layer
38 G2 insulation layer
40 CIP configuration magnetic head
42 CPP configuration magnetic head
50 read sensor
52 read sensor stack
54 electrical leads
56 hard bias layer
60 front edge
62 rear edge
64 left side
66 right side
68 sensor width
69 stripe height
70 front-edge damaged region
72 rear-edge damaged region
74 left-side damaged region
76 right-side damaged region
78 damaged regions
80 front-edge oxidized region
82 rear-edge oxidized region
84 left-side oxidized region
86 right-side oxidized region
88 non-conductive regions
90 dielectric insulation regions

What is claimed is:

1. A magnetic head, comprising:
a read sensor having ferromagnetic material in layers having a front edge, a rear edge, a left-side edge and a right-side edge, wherein said front edge and said rear edge are comprised of oxidized material to form non-conductive regions.

2. The magnetic head of claim 1, wherein said read sensor is of CIP configuration.

3. The magnetic head of claim 1, wherein said read sensor is of CPP configuration, and said left-side edge and said right-side edge are comprised of oxidized material to form non-conductive regions.

4. The magnetic head of claim 1, wherein said oxidation is performed by application of a process chosen from the group of processes consisting of oxygen plasma exposure, nitrogen plasma exposure and ozone exposure.

5. The magnetic head of claim 1, wherein:
said oxidized material is a strip of dimensions in the range of 10 to 100 Angstroms in width.

6. A disk drive comprising:
at least one hard disk;
at least one magnetic head adapted to fly over said hard disk for reading data on said hard disk, and having an air bearing surface, said magnetic head including:
a magnetic read sensor having ferromagnetic material in layers having a front edge, a rear edge, a left-side edge and a right-side edge, wherein said front edge and said rear edge are comprised of oxidized material to form non-conductive regions.

7. The disk drive of claim 6, wherein said read sensor is of CIP configuration.

8. The disk drive of claim 6, wherein said read sensor is of CPP configuration, and said left-side edge and said right-side edge are oxidized to form non-conductive regions.

9. The disk drive of claim 6, wherein said oxidation is performed by application of a process chosen from the group of processes consisting of oxygen plasma exposure, nitrogen plasma exposure and ozone exposure.

10. The disk drive of claim 6, wherein:
said oxidized material is a strip of dimensions in the range of 10 to 100 Angstroms in width.

11. A method of fabrication of a magnetic head including a read head sensor comprising:

A) providing a read sensor stack having ferromagnetic material in layers having a front edge, a rear edge, a right-side edge and a left-side edge;

B) trimming said left-side edge and said right-side edge to pattern the sensor width;

C) depositing a hard bias layer adjacent to said left-side edge and said right-side edge of said sensor;

D) trimming said rear edge of said sensor to pattern the stripe height of said sensor;

E) oxidizing said rear edge of said sensor;

F) lapping said front edge of said sensor; and

G) oxidizing said front edge of said sensor.

12. The method of claim 11, wherein said read sensor is of CIP configuration.

13. The method of claim 12, wherein C includes:

a) depositing an electrical lead layer on said hard bias layer.

14. The method of claim 12, wherein E includes:

a) depositing a dielectric material to encapsulate said oxidized rear edge.

15. The method of claim 11, wherein said read sensor is of CPP configuration.

16. The method of claim 15, wherein B includes:

a) oxidizing said left-side edge and said right-side edge of said sensor.

17. The method of claim 16, wherein B further includes:

b) depositing a dielectric material on said oxidized left-side edge and said right-side edge of said sensor.

18. The method of claim 15, wherein E includes:

a) depositing a dielectric material to encapsulate said oxidized rear edge.

19. The method of claim 11, wherein:

said oxidizing is performed on a strip of dimensions in the range of 10 to 100 Angstroms in width.

20. The method of claim 11, wherein said oxidation is performed by application of a process chosen from the group of processes consisting of oxygen plasma exposure, nitrogen plasma exposure and ozone exposure.

* * * * *